(12) United States Patent
Ravi

(10) Patent No.: US 6,830,813 B2
(45) Date of Patent: Dec. 14, 2004

(54) STRESS-REDUCING STRUCTURE FOR ELECTRONIC DEVICES

(75) Inventor: Kramadhati V. Ravi, Atherton, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/401,462

(22) Filed: Mar. 27, 2003

(65) Prior Publication Data

US 2004/0191534 A1 Sep. 30, 2004

(51) Int. Cl.$^7$ .................................................. B32B 9/00
(52) U.S. Cl. ...................... 428/408; 428/446; 428/698; 428/699; 428/702; 257/706; 438/121; 438/122
(58) Field of Search ................................ 428/408, 446, 428/450, 697, 699, 701, 702; 438/121, 122; 257/706

(56) References Cited

U.S. PATENT DOCUMENTS

| | | | | |
|---|---|---|---|---|
| 5,186,785 A | * | 2/1993 | Annamalai | 428/446 |
| 5,488,539 A | * | 1/1996 | Testa et al. | 361/720 |
| 5,566,752 A | * | 10/1996 | Arnold et al. | 165/185 |
| 5,858,537 A | * | 1/1999 | Brown et al. | 428/408 |

OTHER PUBLICATIONS

Kostrzewa, M., et al., "Testing the Feasibility of Strain Relaxed Complaint Substrates", *Electronic Materials Conference, Santa Barbara*, Abstract, (Jun. 2002), p. 8.

Moran, Peter, et al., "Strain Relexation in Wafer–Bonded SiGe/Si Heterostructures Due to Viscous Flow of an Underlying Borosilicate Glass", *Electronic Materials Conference, Santa Barbara*, Abstract, (Jun. 2002), pp. 8–9.

Yin, Haizhou, et al., "High Ge–Content Relaxed Si1–xGex Layers by Relaxation on Complaint Substrate with Controlled Oxidation", *Electronic Materials Conference, Santa Barbara*, Abstract, (Jun. 2002), p. 8.

* cited by examiner

Primary Examiner—Stephen Stein
(74) Attorney, Agent, or Firm—Michael D. Plimier

(57) ABSTRACT

Electronic apparatus having a heat transfer/stress-reducing layer combined with a device layer and methods of fabricating such electronic apparatus provide a means for incorporating a heat transfer layer in an integrated circuit. A structure with a diamond layer incorporated beneath a device layer provides a heat transfer layer for the structure. In an embodiment, a compliant layer is formed between a diamond layer and a substrate to provide stress reduction. In another embodiment, a diamond layer is formed as a layer of islands of diamond from nucleation centers to provide stress reduction.

39 Claims, 7 Drawing Sheets

STRESS-REDUCING STRUCTURE FOR ELECTRONIC DEVICES

TECHNICAL FIELD

Embodiments of the invention relate generally to semiconductor processing.

BACKGROUND

As integrated circuits are scaled down allowing the number of electronic devices on a die to increase, the amount of heat generated during the operation of these integrated circuits increases. Additional ways to remove the generated heat become necessary. One approach to remove heat is to incorporate material layers in a die that provide thermal conductivity away from the integrated circuits formed on the die. However, the incorporated material layers used should not create additional problems in the design, operation, or fabrication of the integrated circuit or die.

DETAILED DESCRIPTION

Figure 1:
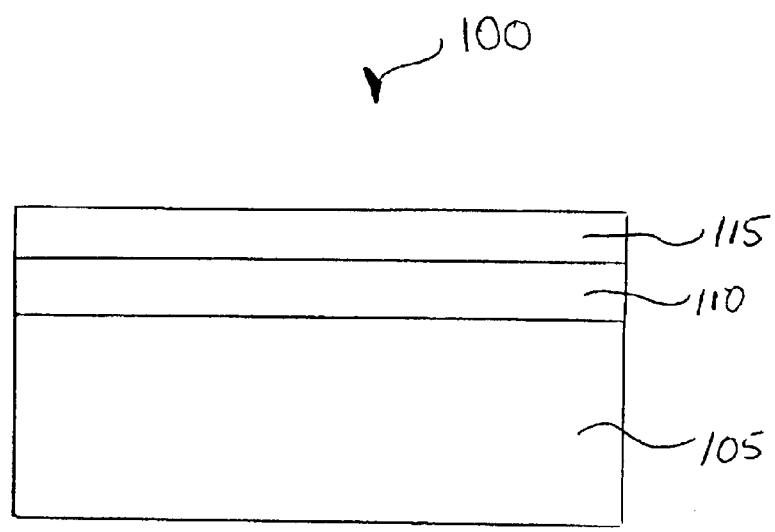
FIG. 1 illustrates an embodiment of an electronic apparatus having a substrate, a heat transfer/stress-reducing structure on the substrate, and a device layer on the stress-reducing structure, in accordance with the present invention.

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized and structural, logical, and electrical changes may be made without departing from the scope of the invention. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form an integrated circuit (IC). The term substrate is understood to include semiconductor wafers. The term substrate may also be used to refer to semiconductor structures during processing, and may include other layers that have been fabricated thereupon. Both wafer and substrate may include doped and undoped semiconductors, epitaxial semiconductor layers supported by a base semiconductor or insulator, as well as other semiconductor structures well known to one skilled in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The figures are not drawn to scale and the relative thickness of various layers is also not shown in the drawings. The following detailed description is, therefore, not to be taken in a limiting sense, and the scope of the embodiments of the present invention is defined only by the appended claims, along with the full scope of equivalents to which such claims are entitled.

A structure for an electronic apparatus that includes a layer that provides for enhanced heat transfer from a device layer may improve the performance, reliability, and lifetime for the electronic apparatus. For instance, fabricating diamond layers onto silicon substrates for the manufacture of silicon on diamond (SOD) wafers may enhance device speed performance for structures with diamond layers. However, fabricating the electronic apparatus having a heat transfer layer and a device layer can introduce stress between layers in the electronic apparatus, as a result of the different materials used for the device layer and the heat transfer layer. An example of such an electronic apparatus is a silicon device layer with a diamond heat transfer layer. An embodiment of the present invention includes a heat transfer/stress-reducing layer above which a device layer is formed, where the heat transfer/stress-reducing layer may include a layer or layers that provide heat transfer from the device layer and reduce stress between the various materials comprising the die.

A diamond layer with its high thermal conductivity can spread heat out away from active devices of an integrated circuit. In an embodiment, diamond layers of thicknesses up to 200 microns are formed beneath an active silicon layer. The fabrication of such a wafer involves the deposition of a diamond layer onto a silicon substrate and the subsequent bonding of a single crystal layer above the diamond layer. In an embodiment, a SOD wafer is formed using a heat transfer/stress-reducing structure to alleviate stress that can be produced by differences in the coefficients of thermal expansion (CTE) between diamond and silicon, where the CTE of silicon is $2.4 \times 10^{-6}$ cm/(cm K), and the CTE of diamond is $1.1 \times 10^{-6}$ cm/(cm K). Without providing stress reduction, a wafer can bow and warp when the wafer is cooled from diamond deposition temperature, typically at around 800° C., to room temperature. Electronic apparatus formed using heat transfer/stress-reducing structures of various embodiments as taught herein eliminate or substantially reduce bowing and warpage of the wafer.

FIG. 1 illustrates an embodiment of an electronic apparatus 100 having a substrate 105, a heat transfer/stress-reducing structure 100 on substrate 105, and a device layer 115 on heat transfer/stress-reducing structure 110. In an embodiment, heat transfer/stress-reducing structure 110 includes a compliant layer and a diamond layer on the compliant layer. In an embodiment, heat transfer/stress-reducing structure 110 includes a compliant layer having a thickness less than about 1 micron. In another embodiment, heat transfer/stress-reducing structure 110 is a diamond layer and substrate 105 is a heat sink. In an embodiment, heat transfer/stress-reducing structure 110 includes a diamond layer having a thickness greater than about 100 microns. In another embodiment, heat transfer/stress-reducing structure 110 includes a layer having islands of diamond on substrate 105, where each island of diamond extends at most to contact another island of diamond. In an embodiment, heat transfer/stress-reducing structure 110 includes a layer having islands of diamonds in which each island of diamond does not contact another island of diamond.

Electronic apparatus 100 may be formed by various embodiments of methods for forming device layer 115 with heat transfer/stress-reducing structure 110 between device layer 115 and substrate 105. An embodiment of a method for forming an electronic device includes forming a compliant layer on a substrate, forming a diamond layer on the compliant layer, and forming a device layer above the diamond layer. Depending on the application, various forms of electronic devices can be constructed in the device layer.

Figure 2A:
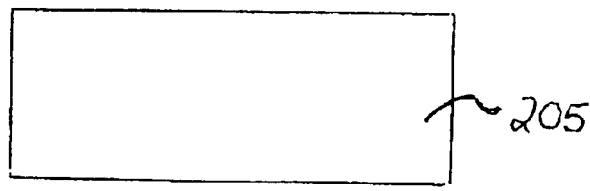
FIGS. 2A–2D show stages for forming an electronic apparatus having a device layer and a heat transfer/stress-reducing structure, in accordance with an embodiment of the present invention.

FIGS. 2A–2D show stages associated with an embodiment for forming an electronic apparatus having a device layer and a heat transfer/stress-reducing structure. FIG. 2A depicts a substrate 205 on which a heat transfer/stress-reducing structure and a device layer are formed in various embodiments. In an embodiment, substrate 205 is a semiconductor substrate. In an embodiment substrate 205 is a silicon substrate. Silicon substrate 205 may be a polycrystalline silicon handle wafer, which provides a relatively low cost element for the manufacturing process.

Figure 2B:
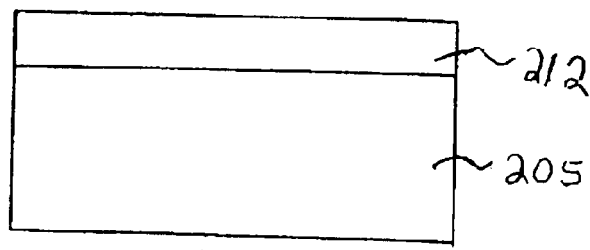

As depicted in FIG. 2B, a compliant layer 212 is formed on substrate 205. In an embodiment, a polysilicon compliant layer is formed by chemical vapor deposition (CVD) processes. Alternately, the polysilicon compliant layer may be formed by other methods as is known to those skilled in the art.

In another embodiment, forming compliant layer 212 includes forming a doped oxide compliant layer. A phosphorus doped oxide such as a phosphorous doped glass (PSG) may be formed as compliant layer 212. Alternately, a boron and phosphorous oxide such as a boron and phosphorous glass (BPSG) may be formed as compliant layer 212. In various embodiments, a PSG layer or a BPSG layer is formed on a silicon substrate.

Figure 2C:
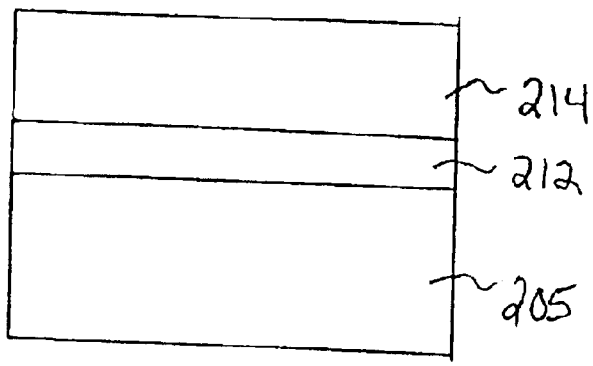

FIG. 2C shows an embodiment of a formation of a diamond layer 214 on compliant layer 212. In an embodiment, diamond layer 214 is deposited by a CVD process. In embodiment, diamond layer 214 is formed above a silicon substrate separated by compliant layer 212, which accommodates the stresses associated with CTE mismatch between diamond and silicon. This prevents or substantially reduces wafer warpage that would occur when diamond layers are deposited directly on silicon substrates. In an embodiment using a polysilicon compliant layer, the polysilicon layer can deform, in response to the stresses introduced in it by the CTE mismatch, by mechanisms of grain boundary sliding, rotation and other stress relief mechanisms characteristic of polycrystalline materials. In an embodiment using phosphorus and/or boron and phosphorous doped oxides, such as PSG and/or BPSG, stress accommodation is a result of viscoelastic flow of the oxide in response to stresses induced in the structure. PSG and BPSG layers may be deposited by CVD processes. The CVD processes include low temperature processes, typically around 400° C. Such compliant layers are typically soft and function as stress absorbing buffer layers between diamond layer 214 and substrate 205.

Figure 2D:
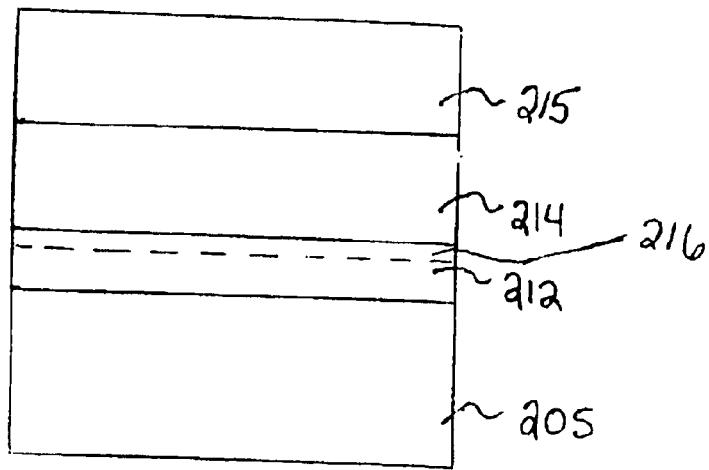

FIG. 2D shows an embodiment of a formation of a device layer 215 on diamond layer 214. Within device layer 215, a wide variety of devices can be formed including, but not limited to, capacitors, diodes, transistors, memory devices, and opto-electronic devices. In an embodiment, device layer 215 is a semiconductor layer. In an embodiment, device layer 215 is a silicon layer. The silicon layer may include single crystalline silicon for device fabrication.

The thicknesses of compliant layer 212 may be limited to less than a micron to avoid introducing high thermal resistance between device layer 215 and diamond layer 214. If compliant layer 212 is thicker than one micron, an additional layer can be formed to provide stress relief such as forming an oxide layer 216 between diamond layer 214 and substrate 205. The oxide layer 216 may be formed on compliant layer 212 or between compliant layer 212 and substrate 205.

Active devices are fabricated in device layer 215. In an embodiment, once the processing of the wafer is completed, individual die forming an electronic apparatus are cut from the completed wafer and each die is bonded to a heat sink. In an embodiment, substrate 205, complaint layer 212, and oxide layer 216 are removed from the completed wafer, and a die having device layer 215 with active devices formed therein and the diamond layer 214 underneath is bonded to a heat sink. With substrate 205, compliant layer 212, and oxide layer 216 removed, diamond layer 214, having been formed in a stress-reducing structure, effectively acts as a heat transfer/stress-reducing structure disposed on a heat sink acting as a substrate. Additionally, embodiments with a diamond layer thickness of 100 microns or greater and the diamond layer bonded to a heat sink with a silicon substrate removed perform with greater speed as compared to a thinner diamond layer embedded on a silicon substrate with the silicon substrate bonded to a heat sink.

Figure 3:
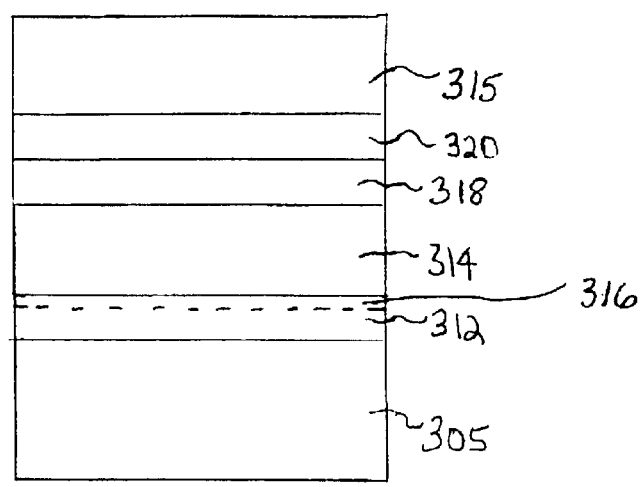
FIG. 3 depicts a formation of a heat transfer/stress-reducing structure and a device layer including additional layers, in accordance with an embodiment of the present invention.

FIG. 3 depicts an embodiment for formation a heat transfer/stress-reducing structure and a device layer including additional layers. The embodiment of FIG. 3 includes a substrate 305, a diamond layer 314, a device layer 315, and additional optional layers. In an embodiment, a polysilicon layer 318 is formed on diamond layer 314 and a silicon oxide layer 320 is formed on the polysilicon layer 318. In another embodiment, a polysilicon layer 318 is formed on diamond layer 314. In another embodiment, a silicon oxide layer 320 is formed on diamond layer 314. In the various embodiments, device layer 315 formed above diamond layer 314 may be a single crystal semiconductor layer. In the various embodiments, device layer 315 formed above diamond layer 314 may be a single crystal silicon layer.

Figure 4A:
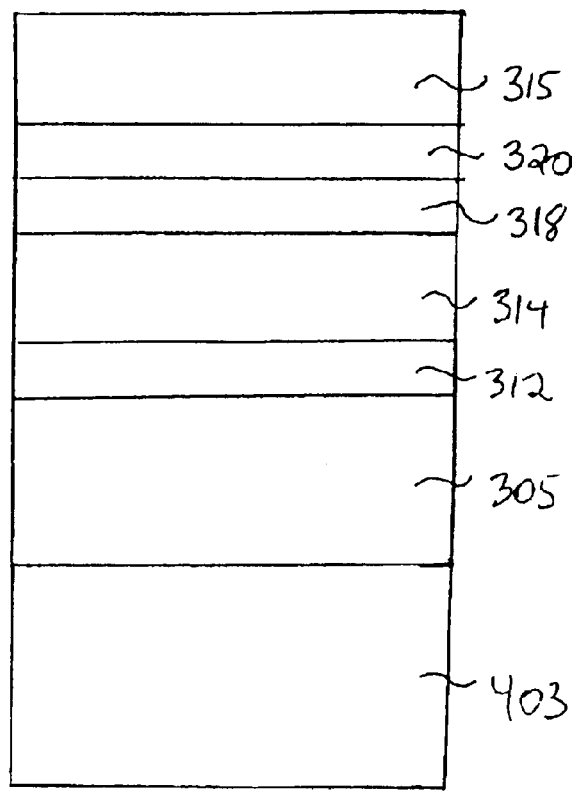
FIG. 4A depicts an embodiment of the structure of FIG. 3 having a compliant layer less than a specified thickness, where a completed die is bonded to a heat sink, in accordance with the present invention.

In an embodiment, further processing of the structure of FIG. 3 depends on whether compliant layer 312 is less than or greater than a specified thickness. FIG. 4A depicts an embodiment with compliant layer 312 less than a specified thickness, where a completed die is bonded to a heat sink 403. A structure having an embodiment of FIG. 3 is formed without oxide layer 316 between diamond layer 314 and substrate 305. Such a structure includes device layer 315, diamond layer 314, compliant layer 312, and a silicon substrate 305 bonded to a heat sink 403. Compliant layer 312 may include a polysilicon compliant layer, a phosphorus doped oxide layer, or a boron and phosphorous doped oxide layer. In an embodiment, a thickness of about 1 micron is used as the specified thickness. Further, optional layers may be formed between device layer 315 and diamond layer 314. Optional layers may include polysilicon layer 318, silicon oxide layer 320, or silicon oxide layer 320 formed on polysilicon layer 318.

Figure 4B:
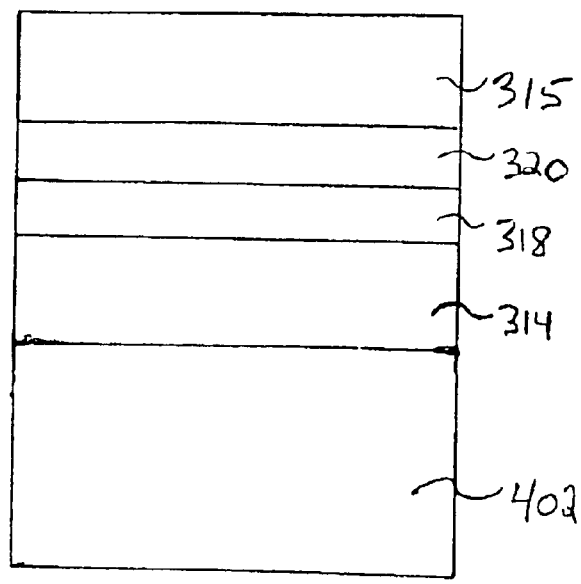
FIG. 4B depicts an embodiment of a structure formed using a compliant layer greater than a specified thickness, where a completed die is bonded to a heat sink, in accordance with the present invention.

FIG. 4B depicts an embodiment of a structure formed using a compliant layer 312 greater than a specified thickness, where a completed die is bonded to a heat sink 402. As shown FIG. 3 oxide layer 316 is formed between diamond layer 314 and substrate 305, and active devices are fabricated in device layer 315. Substrate 305, complaint layer 312, and oxide layer 316 are removed from the completed wafer, and a die having device layer 315 with active devices formed therein and diamond layer 314 underneath is bonded to a heat sink 402. A thickness of about 100 microns for diamond layer 314 provides sufficient support for device layer 315, when diamond layer 314 is bonded directly to heat sink 402. In an embodiment, a thickness of about 1 micron is used as the specified thickness. Further, optional layers may be formed between device layer 315 and diamond layer 314. Optional layers may include polysilicon layer 318, silicon oxide layer 320, or silicon oxide layer 3formed on polysilicon layer 318.

FIGS. 5A–5G show stages associated with another embodiment for forming an electronic apparatus having a device layer and a heat transfer/stress-reducing structure. In an embodiment for forming heat transfer layer combined with device layers, stress reduction is provided by growing discontinuous layers from nucleation centers on a substrate such that each layer extends to just meet, or contact, another layer. In an embodiment, stress reduction depends upon the growth of discontinuous layers as discrete islands of diamond nucleated on a substrate, which just meet when growth of the required thickness of diamond is achieved. In another embodiment, by growing discontinuous diamond layers as islands of diamond with narrow gaps between the islands of diamond, a heat transfer/stress-reducing structure is achieved by the gaps between the diamond islands.

In an embodiment, a method for forming a heat transfer/stress-reducing structure on a substrate includes forming diamond nucleation centers on the substrate and forming an island of diamond on each nucleation center. The nucleation centers are separate from each other and each island of diamond grows on its nucleation center extending to, at most, contact another island of diamond.

Figure 5A:
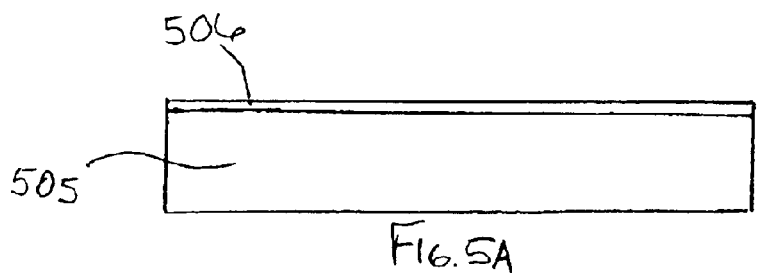
FIGS. 5A–5G show stages associated with another embodiment for forming an electronic apparatus having a device layer and a heat transfer/stress-reducing structure, in accordance with the present invention.

FIG. 5A depicts a substrate 505 on which a heat transfer/stress-reducing structure and a device layer are formed in various embodiments. In an embodiment substrate 505 is a semiconductor substrate. In an embodiment substrate 505 is a silicon substrate. Silicon substrate 505 may be a polycrystalline silicon handle wafer, which provides a relatively low cost element for the manufacturing process.

Diamond nucleation on substrate 505 can be controlled by controlling the surface characteristics of the substrate. Diamond typically does not grow on polished, damage free surfaces. Consequently, prior to diamond deposition the surface of the substrate 505 is treated to create localized surface damage 506. Abrading the surface of substrate 505 with a suitable abrasive, or immersing the substrate in an ultrasonic bath with a suspension of an abrasive creates localized surface damage 506. In an embodiment, the thickness of localized surface damage 506 is less than about 0.5 microns.

Figure 5B:
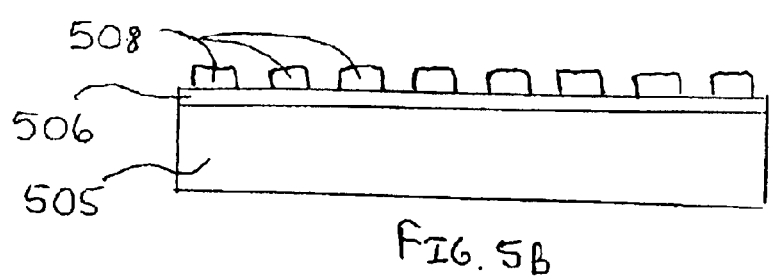

FIG. 5B depicts an embodiment for forming selective nucleation centers including spinning photoresist 508 on the localized surface damage 506. Photoresist 508 is exposed thru a mask, and developed to mask selective regions of the localized surface damage 506 forming a patterned photoresist.

Figure 5C:
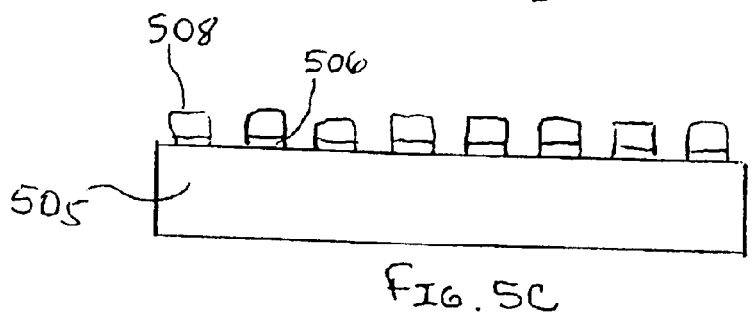

FIG. 5C shows an embodiment in which the exposed parts of the localized surface damage 506 are etched to remove surface damage at these locations. A pattern of pads results on substrate 505. Each pad includes a portion of photoresist 508 on a portion of localized surface damage 506.

Figure 5D:
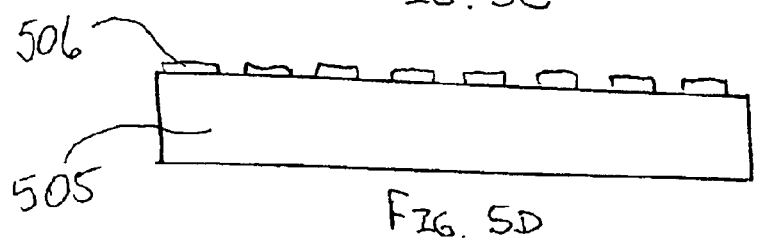
Figure 5E:
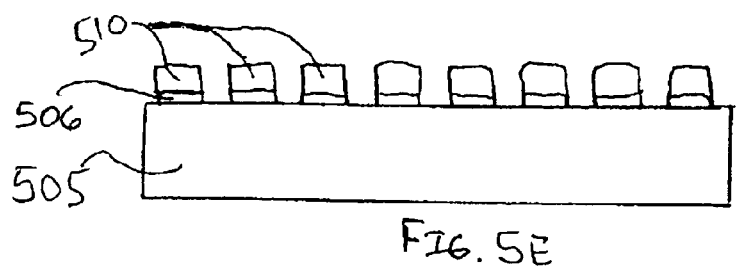

FIG. 5D depicts FIG. 5C with photoresist 508 removed. Localized surface damage 506 remaining after removing photoresist 508 forms nucleation centers. FIG. 5E depicts forming islands of diamond 510 on nucleation centers 506. In an embodiment, diamond is deposit by CVD. Each island of diamond 510 grows from its nucleation center extending horizontally and vertically until contacting another island of diamond.

Figure 5F:
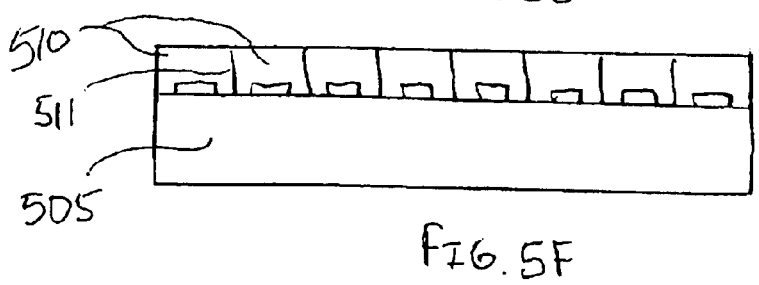

FIG. 5F depicts an embodiment in which the islands of diamond 510 are grown, at most, to extend to where an island of diamond just meets another island. The forming of these islands of diamond form discontinuous diamond layers having a discontinuity 511 along an interface at which two islands of diamond just meet. Discontinuity 511 forms as the islands of diamond contact in a mechanical manner rather than the islands coming together chemically. In an embodiment, growing islands of diamond 510 to the extent to which an island just contacts another island provides a diamond layer having a thicknesses to about 200 microns or less with individual islands of diamond which do not form a continuous layer. In an embodiment, diamond layers having individual diamond islands separated from each other are grown having a thickness ranging from about 10 microns to about 200 microns using plasma enhanced CVD techniques.

A discontinuous diamond layer grown in the formation of a wafer for device fabrication in accordance with this embodiment avoids introducing high stresses in the wafer leading to wafer distortion that typically accompany depositing continuous diamond layers across silicon substrates. Since a continuous layer is not grown the stress induced in the substrate is limited to the stress induced by the individual islands of diamond. Since these islands can be small compared to the total wafer area, the stress induced by the individual islands of diamond is not sufficient to locally distort the wafer. The regions where the islands of diamond just meet provide a discontinuity in the diamond layer and can thus function as stress accommodation, or stress-reducing, regions in the structure.

Figure 5G:
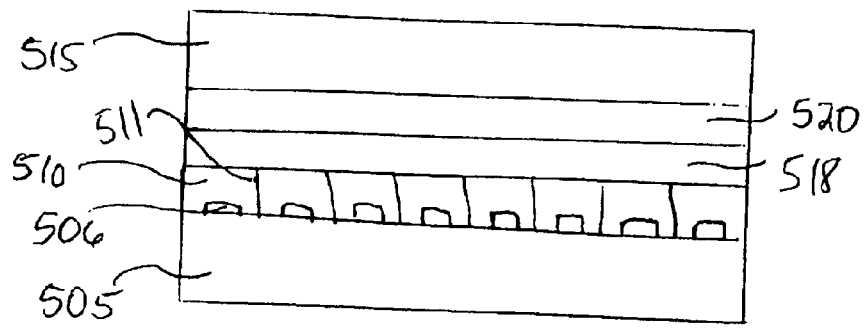

FIG. 5G depicts an embodiment in which a device layer 515 is formed above the islands of diamond 510. In an embodiment, a polysilicon layer 518 is formed over the islands of diamond 510. After forming polysilicon layer 518, the structure is polished. Device layer 515 is then formed on polysilicon layer 518. In an embodiment, device layer 515 is a semiconductor layer. In an embodiment, device layer 515 is formed by bonding a single crystal silicon layer to polysilicon layer 518. The silicon layer bonded to polysilicon layer 518 may be a single crystal silicon layer. In an embodiment, an oxide layer 520 is formed between device layer 515 and polysilicon layer 518. In an embodiment, oxide layer 520 is formed on a silicon layer prior to bonding the silicon layer to polysilicon layer 518, where oxide layer 520 is disposed between silicon device layer 515 and polysilicon layer 518.

Figure 6A:
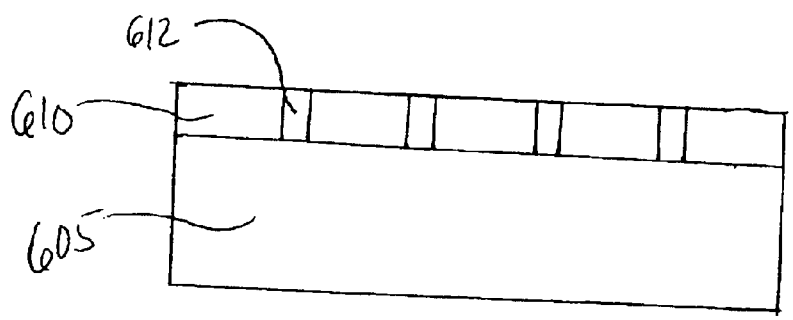
FIG. 6A depicts the formation of islands of diamond on a substrate in which each island of diamond does not contact any other island of diamond, in accordance with an embodiment of the present invention.

FIG. 6A depicts the formation of islands of diamond 610 on a substrate 605 in which each island of diamond does not contact any other island of diamond. The resulting structure includes islands of diamond 610 forming a discontinuous diamond layer on substrate 605 with gaps 612 between the islands of diamond. Since a continuous layer is not grown the stress induced in the substrate is limited to the stress induced by the individual islands of diamond. Since these islands can be small compared to the total wafer area the stress induced by the individual islands of diamond is not sufficient to locally distort the wafer. The gaps between the islands of diamond provide a discontinuity in the diamond layer that functions as stress accommodation, or stress-reducing, regions in the structure.

Figure 6B:
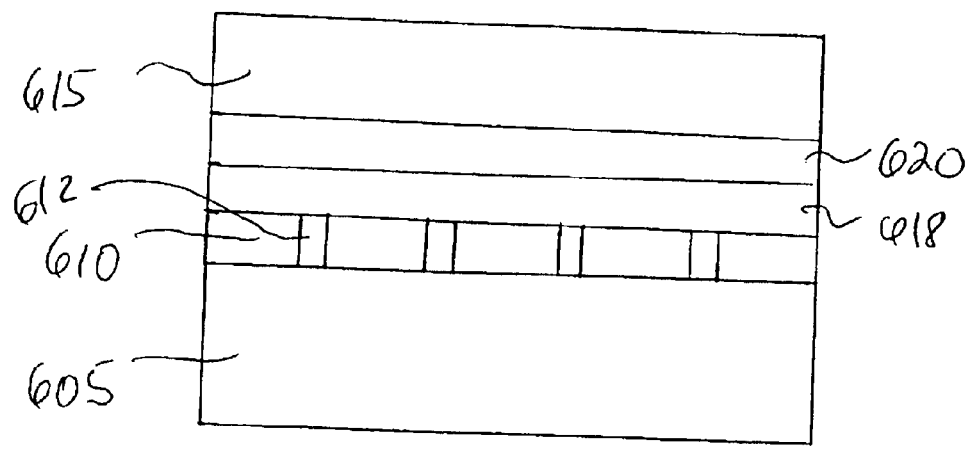
FIG. 6B depicts the formation of a device layer above islands of diamond in which each island of diamond does not contact any other island of diamond, in accordance with an embodiment of the present invention.

FIG. 6B depicts the formation of a device layer 615 above the islands of diamond 610 of FIG. 6A in which each island of diamond does not contact any other island of diamond. In an embodiment, a polysilicon layer 618 is formed over the islands of diamond 610. After forming polysilicon layer 618, the structure is polished. Device layer 615 is then formed on polysilicon layer 618. In an embodiment, device layer 615 is a semiconductor layer. In an embodiment, device layer 615 is formed by bonding a silicon layer to polysilicon layer 618. The silicon layer bonded to polysilicon layer 618 may be a single crystal silicon layer. In an embodiment, an oxide layer 620 is formed between device layer 615 and polysilicon layer 618. In an embodiment, oxide layer 620 is formed on a silicon layer prior to bonding the silicon layer to polysilicon layer 618, where oxide layer 620 is between silicon device layer 615 and polysilicon layer 618.

In an embodiment, the material of substrate 505 or 605 can be replaced by a heat sink. Bonding a diamond layer formed as islands of diamond, 510 or 610, to a heat sink may be accomplished by removing the substrate material by grinding and bonding the diamond layer to the heat sink by conventional bonding techniques. Bonding such a semiconductor on diamond structure in this manner forms the structure of FIG. 5G or 6B where substrate 505 or 605 is a heat sink attached to a heat transfer/stress-reducing structure.

Figure 7:
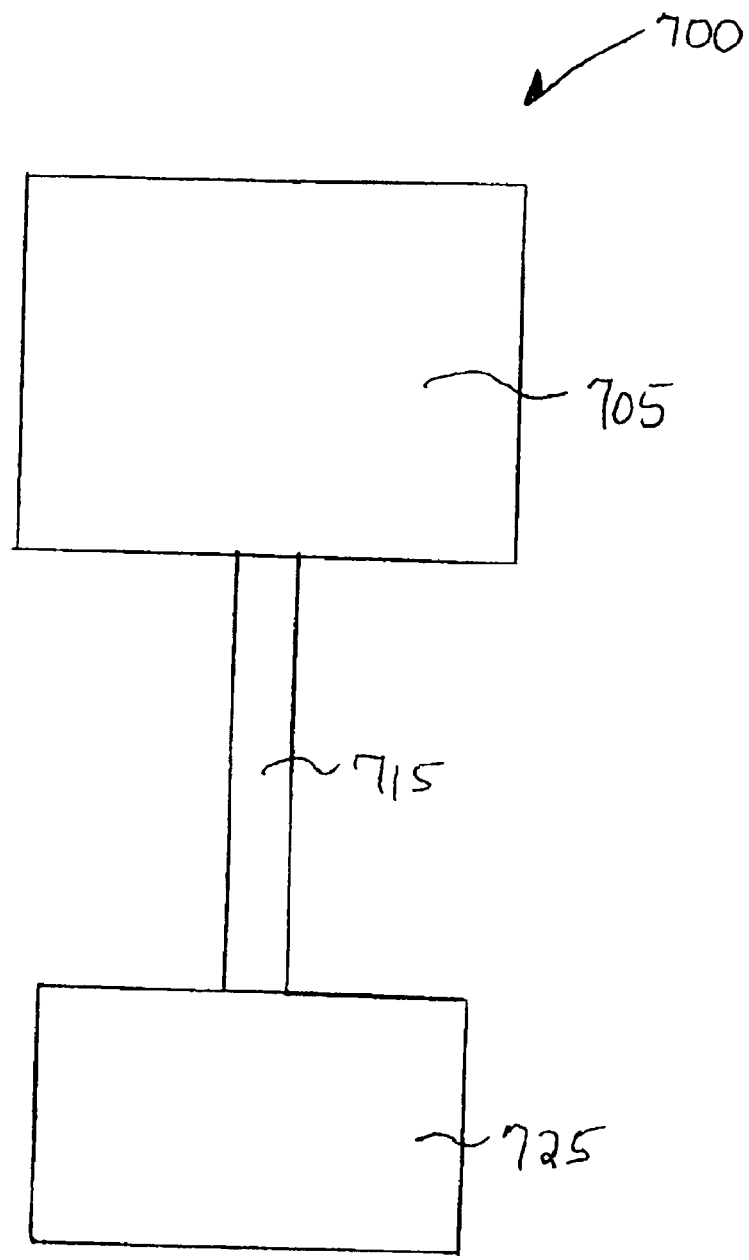
FIG. 7 illustrates a block diagram for a system 700 having devices using an embodiment for a heat transfer/stress-reducing structure combined with a device layer, in accordance with the present invention.

FIG. 7 illustrates a block diagram for a system 700 having devices using an embodiment for a heat transfer/stress-reducing structure combined with a device layer. System 700 includes a controller 705, a bus 715, and an electronic apparatus 725, where bus 715 provides electrical conductivity between controller 705 and electronic apparatus 725. In various embodiments, controller 705 and/or electronic apparatus 725 include an embodiment for a heat transfer/stress-reducing structure combined with a device layer as previously discussed. In an embodiment, electronic system 700 includes a plurality of electronic apparatus using an embodiment of a heat transfer/stress-reducing structure combined with a device layer. Electronic system 700 may include, but is not limited to, information handling devices, wireless systems, telecommunication systems, fiber optic systems, electro-optic systems, and computers. In an embodiment, controller 705 is a processor and electronic apparatus 725 is a memory device.

Embodiments have been described herein to form apparatus having heat transfer/stress-reducing structures combined with active layers. In an embodiment, a diamond layer embedded between a semiconductor device layer and a silicon substrate, or other substrate, forms a semiconductor on diamond wafer for providing an additional heat transfer mechanism to an integrated circuit formed in the active layer. These integrated circuits exhibit increased speed performance for structures having larger diamond layers. In an embodiment, to provide a heat transfer/stress-reducing structure, a compliant layer is interposed between a substrate and a diamond layer. The compliant layer provides stress relief and can include polysilicon, phosphorus doped oxides such as PSG, or boron and phosphorus doped oxides such as BPSG. The introduction of a thin compliant material on a silicon wafer followed by the deposition of a diamond layer on the compliant layer results in the CTE mismatch stresses being reduced by the compliant material, which deforms by viscoelastic flow. Providing this stress relief can prevent distortion of the wafer.

In another embodiment, a heat transfer/stress-reducing structure is provided by selective nucleation centers on a silicon substrate, or other substrate, and forming diamond layers from the nucleation centers in which individual diamond islands are formed separated from each other. The diamond islands are formed such that the vertical and lateral growth of the diamond islands continues, at most, until the diamond islands just meet. By forming islands of diamond rather than a single continuous diamond layer, the differences in the CTE mismatch between the substrate material and diamond are counteracted providing stress relief and resulting in a flat wafer that can be further processed.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon reviewing the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. A method comprising:
   forming a heat transfer/stress-reducing structure above a substrate; and
   forming a device layer disposed above the heat transfer/stress-reducing structure.

2. The method of claim 1, wherein forming a heat transfer/stress-reducing structure above a substrate includes:
   forming a compliant layer above the substrate; and
   forming a diamond layer above the compliant layer.

3. The method of claim 2, wherein forming a compliant layer includes forming a polysilicon compliant layer or a doped oxide compliant layer.

4. A method comprising:
   forming a heat transfer/stress-reducing structure above a substrate;
   forming a device layer disposed above the heat transfer/stress-reducing structure;

wherein forming a heat transfer/stress-reducing structure above a substrate includes:
  forming a compliant layer above the substrate; and
  forming a diamond layer above the compliant layer;
wherein forming a compliant layer includes forming a polysilicon compliant layer or a doped oxide compliant layer; and
wherein forming a doped oxide compliant layer includes forming a phosphorus doped oxide, a boron and phosphorous doped oxide, or a phosphorus doped oxide and a boron and phosphorous doped oxide.

5. A method comprising:
  forming a heat transfer/stress-reducing g structure above a substrate;
  forming a device layer disposed above the heat transfer/stress-reducing structure;
  wherein forming a heat transfer/stress-reducing structure above a substrate includes:
    forming a compliant layer above the substrate; and
    forming a diamond layer above the compliant layer; and
  wherein forming a compliant layer includes forming the compliant layer having a thickness less than about 1 micron.

6. The method of claim 2, wherein the method further includes removing the compliant layer and the substrate.

7. The method of claim 5, wherein the method further includes bonding the diamond layer to a heat sink.

8. The method of claim 2, wherein forming a diamond layer includes forming the diamond layer having a thickness greater than about 100 microns.

9. A method comprising:
  forming a heat transfer/stress-reducing structure above a substrate; forming a device layer disposed above the heat transfer/stress-reducing structure; and
  wherein forming a heat transfer/stress-reducing structure above a substrate includes:
    forming diamond nucleation centers above the substrate, each diamond nucleation center separated from each of the other diamond nucleation centers; and
    forming an island of diamond on each diamond nucleation center, each island extending to at most contact another island.

10. The method of claim 9, wherein the method further includes creating surface damage on the substrate prior to forming diamond nucleation centers above the substrate.

11. The method of claim 9, wherein forming an island of diamond includes forming an island of diamond having a thickness ranging from about 10 microns to about 200 microns.

12. The method of claim 9, wherein forming an island of diamond on each diamond nucleation center includes forming an island of diamond on each diamond nucleation center such that each island does not contact another island.

13. The method of claim 9, wherein forming a device layer disposed above the heat transfer/stress-reducing structure includes bonding a single crystal semiconductor layer disposed above the islands of diamond.

14. The method of claim 13, wherein the method further includes
  forming a polysilicon layer above the islands of diamond; and
  forming an oxide above the polysilicon layer.

15. The method of claim 13, wherein bonding a single crystal semiconductor layer includes bonding a single crystal semiconductor layer to a polysilicon layer.

16. An apparatus comprising:
  a substrate;
  a heat transfer/stress-reducing structure above the substrate; and
  a device layer disposed above the heat transfer/stress-reducing structure.

17. The apparatus of claim 16, wherein the heat transfer/stress-reducing structure includes:
  a compliant layer; and
  a diamond layer above the compliant layer.

18. The apparatus of claim 17, wherein the substrate includes silicon and the device layer includes single crystal silicon.

19. An apparatus comprising:
  a substrate;
  a heat transfer/stress-reducing structure above the substrate;
  a device layer disposed above the heat transfer/stress-reducing structure;
  wherein the heat transfer/stress-reducing structure includes:
    a compliant layer; and
    a diamond layer above the compliant layer; and
  wherein the compliant layer has a thickness less than about 1 micron.

20. The apparatus of claim 17, wherein the compliant layer is a polysilicon compliant layer or a doped oxide compliant layer.

21. An apparatus comprising:
  a substrate;
  a heat transfer/stress-reducing structure above the substrate;
  a device layer disposed above the heat transfer/stress-reducing structure;
  wherein the heat transfer/stress-reducing structure includes:
    a compliant layer; and
    a diamond layer above the compliant layer;
  wherein the compliant layer is a polysilicon compliant layer or a doped oxide compliant layer; and
  wherein the doped oxide compliant layer is a phosphorus doped oxide, a boron and phosphorous doped oxide, or a phosphorus doped oxide and a boron and phosphorous doped oxide.

22. The apparatus of claim 16, wherein the heat transfer/stress-reducing structure includes a diamond layer and the substrate is a heat sink.

23. The apparatus of claim 22, wherein the diamond layer has a thickness greater than about 100 microns.

24. An apparatus comprising:
  a substrate;
  a heat transfer/stress-reducing structure above the substrate;
  a device layer disposed above the heat transfer/stress-reducing structure; and
  wherein the heat transfer/stress-reducing structure includes a layer having islands of diamond, each island extends at most to contact another island.

25. The apparatus of claim 24, wherein each island of diamond has a thickness ranging from about 10 microns to about 200 microns.

26. The apparatus of claim 24, further including a polysilicon layer disposed above the islands of diamond.

27. The apparatus of claim 24, further including an oxide above which the device layer is disposed above the islands of diamond.

28. The apparatus of claim 24, wherein each island of diamond does not contact another island.

29. The apparatus of claim 24, wherein the device layer is a single crystal silicon layer.

30. A system comprising:
- a controller;
- a bus; and
- an electronic apparatus coupled to the controller by the bus, wherein at least one of the controller and the electronic apparatus includes:
  - a substrate;
  - a heat transfer/stress-reducing structure above the substrate; and
  - a device layer disposed above the heat transfer/stress-reducing structure.

31. The system of claim 30, wherein the heat transfer/stress-reducing structure includes a compliant layer and a diamond layer above the compliant layer.

32. A system comprising:
- a controller;
- a bus;
- an electronic apparatus coupled to the controller by the bus, wherein at least one of the controller and the electronic apparatus includes:
  - a substrate;
  - a heat transfer/stress-reducing structure above the substrate; and
  - a device layer disposed above the heat transfer/stress-reducing structure;
- wherein the heat transfer/stress-reducing structure includes a compliant layer and a diamond layer above the compliant layer; and
- wherein the compliant layer has a thickness less than about 1 micron.

33. The system of claim 31, wherein the compliant layer is a polysilicon compliant layer or a doped oxide compliant layer.

34. The system of claim 30, wherein the heat transfer/stress-reducing structure is a diamond layer and the substrate is a heat sink.

35. The system of claim 34, wherein the diamond layer has a thickness greater than about 100 microns.

36. A system comprising:
- a controller;
- a bus;
- an electronic apparatus coupled to the controller by the bus, wherein at least one of the controller and the electronic apparatus includes:
  - a substrate;
  - a heat transfer/stress-reducing structure above the substrate; and
  - a device layer disposed above the heat transfer/stress-reducing structure; and
- wherein the heat transfer/stress-reducing structure includes a layer having islands of diamond, each island extends at most to contact another island.

37. The system of claim 36, wherein each island of diamond has a thickness ranging from about 10 microns to about 200 microns.

38. The system of claim 36, further including a polysilicon layer disposed above the islands of diamond and an oxide disposed above the polysilicon layer.

39. The system of claim 36, wherein each island of diamond does not contact another island.

* * * * *